(12) United States Patent
Yu et al.

(10) Patent No.: US 11,935,928 B2
(45) Date of Patent: Mar. 19, 2024

(54) BIPOLAR TRANSISTOR WITH SELF-ALIGNED ASYMMETRIC SPACER

(71) Applicant: GLOBALFOUNDRIES U.S. Inc., Malta, NY (US)

(72) Inventors: Hong Yu, Clifton Park, NY (US); Jianwei Peng, Clifton Park, NY (US); Vibhor Jain, Williston, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 17/747,476

(22) Filed: May 18, 2022

(65) Prior Publication Data

US 2023/0268401 A1    Aug. 24, 2023

Related U.S. Application Data

(60) Provisional application No. 63/312,979, filed on Feb. 23, 2022.

(51) Int. Cl.
| | |
|---|---|
| *H01L 29/417* | (2006.01) |
| *H01L 29/08* | (2006.01) |
| *H01L 29/10* | (2006.01) |
| *H01L 29/423* | (2006.01) |
| *H01L 29/66* | (2006.01) |
| *H01L 29/737* | (2006.01) |

(52) U.S. Cl.
CPC .... *H01L 29/41708* (2013.01); *H01L 29/0804* (2013.01); *H01L 29/0821* (2013.01); *H01L 29/1008* (2013.01); *H01L 29/42304* (2013.01); *H01L 29/66242* (2013.01); *H01L 29/7371* (2013.01)

(58) Field of Classification Search
CPC .......... H01L 29/66242; H01L 29/6625; H01L 29/735

See application file for complete search history.

(56) References Cited

U.S. PATENT DOCUMENTS

| | | | |
|---|---|---|---|
| 6,949,764 | B2 | 9/2005 | Ning |
| 7,776,700 | B2 | 8/2010 | Yang et al. |
| 8,288,758 | B2 | 10/2012 | Ning et al. |
| 8,420,493 | B2 | 4/2013 | Ning et al. |
| 8,586,441 | B1 | 11/2013 | Cai et al. |

(Continued)

FOREIGN PATENT DOCUMENTS

EP          4170727      4/2023

OTHER PUBLICATIONS

Application and Drawings in U.S. Appl. No. 17/525,256, filed Nov. 12, 2021, 27 pages.

(Continued)

*Primary Examiner* — Syed I Gheyas
(74) *Attorney, Agent, or Firm* — Andrew M. Calderon; Calderon Safran & Cole, P.C.

(57) ABSTRACT

The present disclosure relates to semiconductor structures and, more particularly, to a bipolar transistor with self-aligned asymmetric spacer and methods of manufacture. The structure includes: a base formed on a semiconductor substrate; an asymmetrical spacer surrounding the base; an emitter on a first side of the base and separated from the base by the asymmetrical spacer; and a collector on a second side of the base and separated from the base by the asymmetrical spacer.

19 Claims, 7 Drawing Sheets

(56) References Cited

U.S. PATENT DOCUMENTS

| | | |
|---|---|---|
| 9,105,680 B2 | 8/2015 | Andenna et al. |
| 10,014,397 B1 | 7/2018 | Jain et al. |
| 10,825,921 B2 | 11/2020 | Balakrishnan et al. |
| 2012/0139009 A1 | 6/2012 | Ning |
| 2012/0235151 A1* | 9/2012 | Cai .................. H01L 29/66265 |
| | | 257/65 |
| 2021/0091214 A1* | 3/2021 | Ho ...................... H01L 29/7371 |
| 2021/0226044 A1 | 7/2021 | Derrickson |

OTHER PUBLICATIONS

Mai et al., "Cost-Effective Integration of RF-LDMOS Transistors in 0.13 µm CMOS Technology", IEEE Topical Meeting on Silicon Monolithic Integrated Circuits in RF Systems, 2009, Abstract, 2 pages.

Muller et al., "High-Performance 15-V Novel LDMOS Transistor Architecture in a 0.25-µm BiCMOS Process for RF-Power Applications", IEEE Transactions on Electron Devices, vol. 54, Issue 4, Apr. 2007, Abstract, 2 pages.

Szelag et al., "High RF performances asymmetric spacer NLDMOS integration in a 0.25µm SiGe:C BiCMOS Technology", Bipolar/BiCMOS Circuits and Technology Meeting, 2006, Abstract, 2 pages.

Application and Drawings in U.S. Appl. No. 17/324,183, filed May 19, 2021, 40 pages.

Search Report in related EP Application No. 22201778.2-1212 dated Jul. 7, 2023, 10 pages.

* cited by examiner

BIPOLAR TRANSISTOR WITH SELF-ALIGNED ASYMMETRIC SPACER

BACKGROUND

The present disclosure relates to semiconductor structures and, more particularly, to a bipolar transistor with self-aligned asymmetric spacer and methods of manufacture.

Bipolar transistors can be vertical transistors or lateral transistors. Vertical bipolar transistors can be used for many different types of applications, e.g., ranging from high performance applications to low performance applications. For example, bipolar transistors can be used in mm-wave power amplifiers and low noise amplifiers, automotive radars and optical interconnects.

Typically, heterojunction bipolar transistors are formed in bulk substrate or in a cavity touching a handle wafer for a semiconductor-on-insulator (SOI) substrate. To manufacture these devices, many complex processing steps are required. Also, lateral bipolar transistors need SiGe intrinsic base for high fT/fmax and beta.

SUMMARY

In an aspect of the disclosure, a structure comprises: a base formed on a semiconductor substrate; an asymmetrical spacer surrounding the base; an emitter on a first side of the base and separated from the base by the asymmetrical spacer; and a collector on a second side of the base and separated from the base by the asymmetrical spacer.

In an aspect of the disclosure, a structure comprises: an extrinsic base formed over a semiconductor on insulator substrate; an asymmetrical spacer comprising a vertical sidewall and an L-shaped sidewall; an emitter separated from the extrinsic base by the vertical sidewall of the asymmetrical spacer; and a collector separated from the extrinsic base by the L-shaped sidewall of the asymmetrical spacer.

In an aspect of the disclosure, a method comprises: forming a base on a semiconductor substrate; forming an asymmetrical spacer surrounding the base; forming an emitter on a first side of the base and separated from the base by the asymmetrical spacer; and forming a collector on a second side of the base and separated from the base by the asymmetrical spacer.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a bipolar transistor with self-aligned asymmetric spacer and methods of manufacture. More specifically, the present disclosure relates to a self-aligned asymmetric spacer scheme for a lateral SiGe heterojunction bipolar transistor. In embodiments, the self-aligned asymmetric spacer scheme includes an L-shape spacer formed between a base and collector. Advantageously, the L-shape spacer reduces the base to collector capacitance (Cbc), while also improving the breakdown voltage. In addition, the L-shape spacer does not require any additional masks compared to conventional spacer formation.

The self-aligned asymmetric spacer of the present disclosure can be manufactured in a number of ways using a number of different tools. In general, though, the methodologies and tools are used to form structures with dimensions in the micrometer and nanometer scale. The methodologies, i.e., technologies, employed to manufacture the self-aligned asymmetric spacer of the present disclosure have been adopted from integrated circuit (IC) technology. For example, the structures are built on wafers and are realized in films of material patterned by photolithographic processes on the top of a wafer. In particular, the fabrication of the self-aligned asymmetric spacer uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
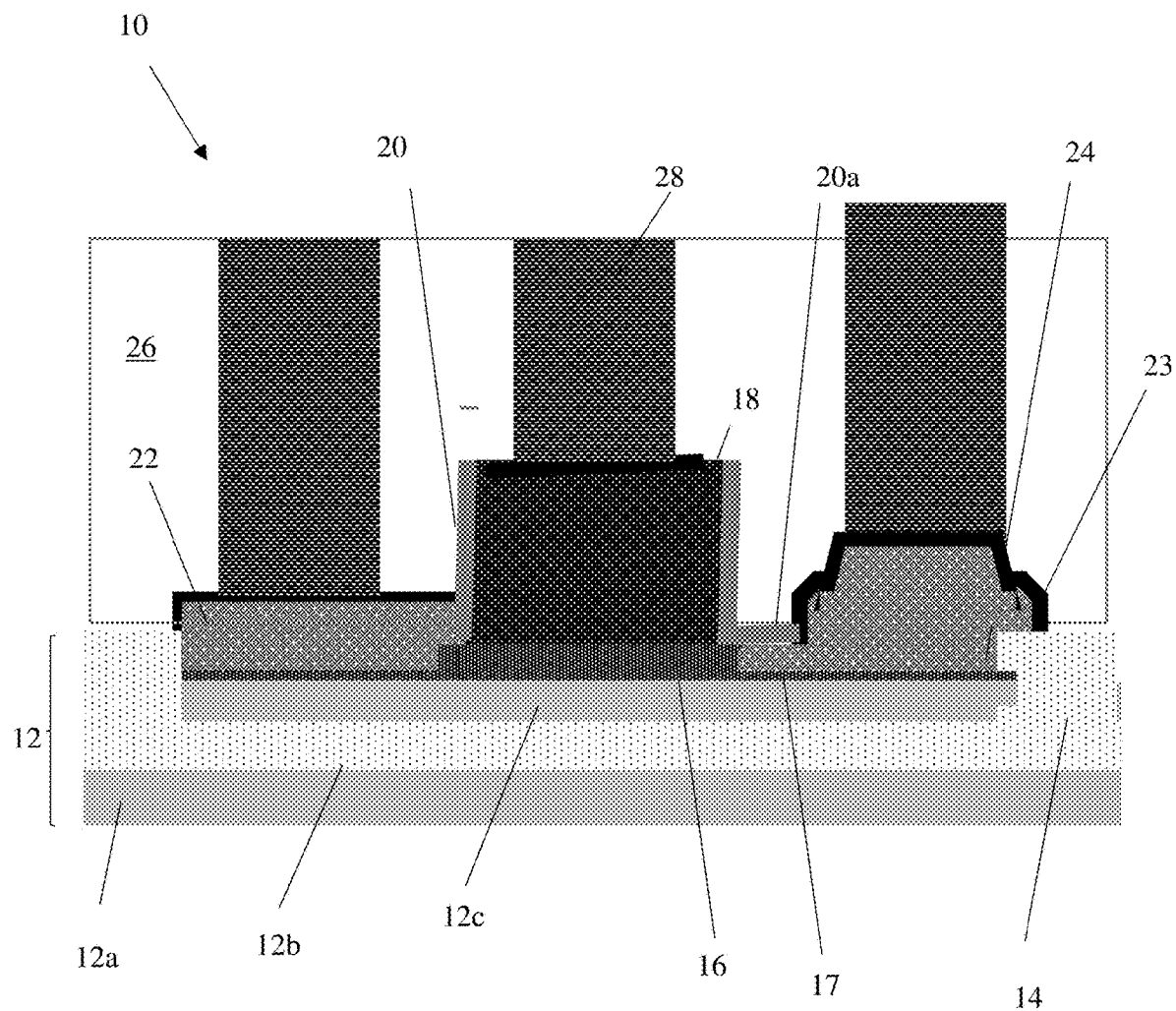
FIG. 1 shows a lateral heterojunction bipolar transistor in accordance with aspects of the present disclosure.

FIG. 1 shows a lateral heterojunction bipolar transistor in accordance with aspects of the present disclosure. More specifically, the structure 10 shown in FIG. 1 includes a substrate 12. In embodiments, the substrate 12 includes a handle substrate 12a, a buried insulator layer 12b and a semiconductor layer 12c. The handle substrate 12a provides mechanical support to the buried insulator layer 12b and the top semiconductor layer 12c.

In embodiments, the handle substrate 12a and the semiconductor layer 12c may include any appropriate semiconductor material such as, for example, Si, Ge, SiGe, SiC, SiGeC, a III-V compound semiconductor, II-VI compound semiconductor or any combinations thereof. The handle substrate 12a and the semiconductor layer 12c may also comprise any suitable crystallographic orientation (e.g., a (100), (110), (111), or (001) crystallographic orientation). The buried insulator layer 12b may be a dielectric material such as silicon dioxide, silicon nitride, silicon oxynitride, boron nitride or a combination thereof, and preferably may be buried oxide layer (BOX). The buried insulator layer 12b is formed by any suitable process, such as separation by implantation of oxygen (SIMOX), oxidation, deposition, and/or other suitable process.

Shallow trench isolation structures 14 may be provided in the semiconductor layer 12c and extend to the buried insulator layer 12b. The shallow trench isolation structures 14 effectively isolate the lateral bipolar junction transistor from other devices. As described herein, the shallow trench isolation structures 14 may be fabricated using conventional lithography, etching and deposition methods.

A base 16 (e.g., intrinsic base) may be formed over the semiconductor layer 12c. The base 16 may be SiGe material, which is epitaxially grown on the semiconductor layer 12c followed by patterning processes, e.g., lithography and etching processes as described in more detail with respect to FIGS. 2D and 2E. An extrinsic base 18 may be formed on the base 16. In embodiments, the extrinsic base 18 may be P+ semiconductor material, e.g., Si.

Still referring to FIG. 1, an emitter 22 may be formed on a first side of the extrinsic base 18 (and intrinsic base 16) and a collector 24 may be formed on a second side of the base 16. Accordingly, the emitter 22, collector 24 and the base 18 may be laterally positioned in a horizontal plane forming a lateral bipolar transistor. Both the collector 24 and the emitter 22 may comprise raised epitaxial semiconductor material on opposing sides of the base 16. In more specific embodiments, the collector 24 and the emitter 22 may be N+ Si material. The collector 24 and the emitter 22 may be formed over an optional marker layer 17, e.g., SiGe, over and in direct contact with the semiconductor layer 12c.

Also, as shown in FIG. 1, spacer 20, 20a separates (e.g., isolates) the extrinsic base 18 from the collector 24 and the emitter 22, and more specifically separates contacts 28 on the extrinsic base 18 from the collector 24 and emitter 22. The spacer 20, 20a may be a SiN, for example. The spacer 20, 20a may be an asymmetrical spacer, with the spacer portion 20a on the collector side (e.g., between the collector 24 and extrinsic base 18) being an L-shape, whereas the spacer portion 20 on the emitter side (e.g., between the emitter 22 and extrinsic base 18) may be straight (e.g., vertical). In embodiments, the spacer 20a may be thicker than the spacer 20 and, more specifically, the bottom of spacer 20a on the collector side may be greater than 2 nm.

In embodiments, the collector 24 may be farther from the extrinsic base 18 than the emitter 22 due the use of the asymmetrical spacer 20, 20a about the extrinsic base 18. In this way, by incorporating the asymmetrical spacer 20, 20a, it is now possible to reduce the base to collector capacitance (Cbc), while also improving (e.g., increasing) the breakdown voltage. In addition, the asymmetrical spacer 20, 20a allows the emitter 22 to be closer to the extrinsic base 18 thus increasing the injection frequency for improved RF performance. Also, in embodiments, due to the spacer difference, the L-shape spacer 20a tends to facet back the collector 24. Accordingly, the collector 24 and the emitter 22 may have a different thickness or shape.

FIG. 1 further shows a silicide 23 on the emitter 22, extrinsic base 18 and collector 24. As described in more detail herein, the silicide 23 may be formed using conventional silicide processes. A plurality of contacts 28 within dielectric material 26 may contact the emitter 22, extrinsic base 18 and collector 24. More specifically, the plurality of contacts 28 contact the silicide 23 over the emitter 22, extrinsic base 18 and collector 24.

Figure 2A:
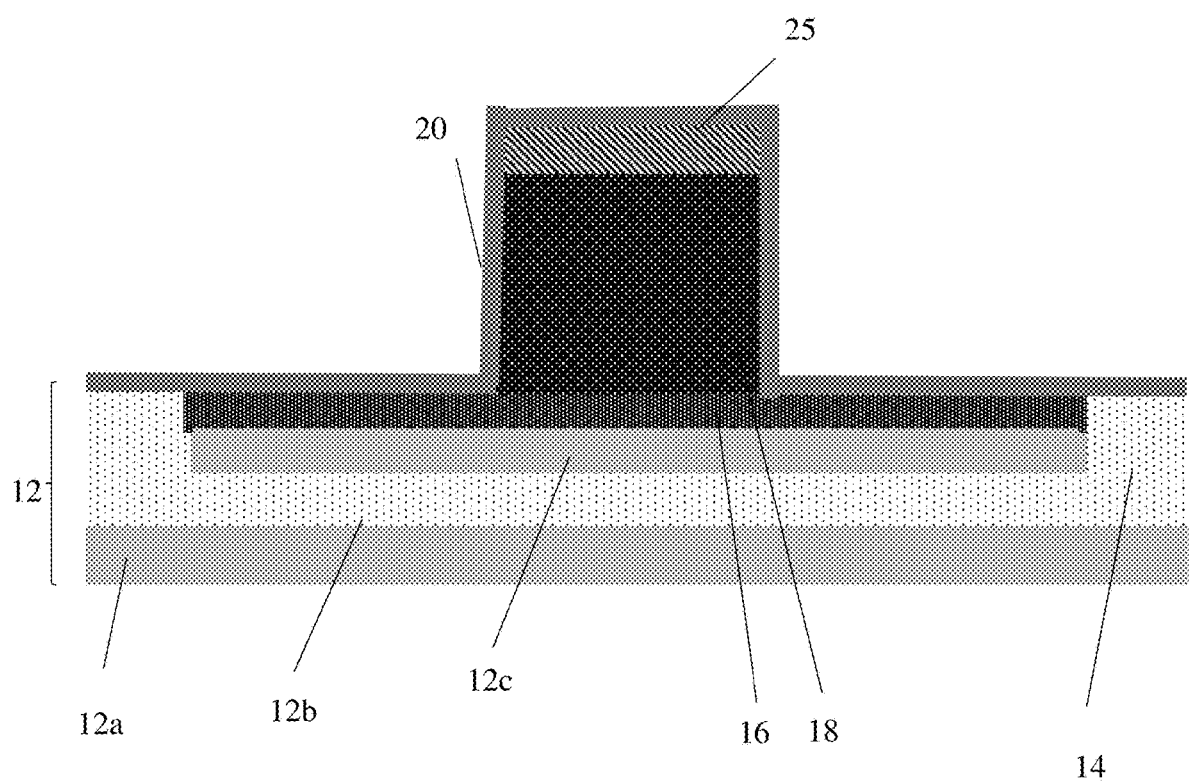
FIGS. 2A-2F show processing steps for fabricating the lateral heterojunction bipolar transistor of FIG. 1 in accordance with aspects of the present disclosure.

FIGS. 2A-2F show processing steps for fabricating the lateral heterojunction bipolar transistor of FIG. 1. In FIG. 2A, the handle substrate 12a may be thinned by a conventional thinning process, e.g., chemical mechanical polishing. The handle substrate 12a may also be subjected to an ion implantation process to form a P+ substrate under the buried insulator layer 12b. In further embodiments, the intrinsic base material 16 may be formed over the semiconductor layer 12c by an epitaxial growth process. In embodiments, the intrinsic base material 16 may be SiGe material.

Shallow trench isolation structures 14 may be formed through the intrinsic base material 16 and the semiconductor layer 12c. The shallow trench isolation structures 14 can be formed by conventional lithography, etching and deposition methods known to those of skill in the art. For example, a resist formed over the intrinsic base material 16 is exposed to energy (light) and developed to form a pattern (opening). An etching process with a selective chemistry, e.g., reactive ion etching (RIE), will be used to transfer the pattern from the patterned resist layer to the intrinsic base material 16 and the semiconductor layer 12c to form one or more trenches in the intrinsic base material 16 and the semiconductor layer 12c. Following the resist removal by a conventional oxygen ashing process or other known stripants, insulator material (e.g., $SiO_2$) can be deposited by any conventional deposition processes, e.g., chemical vapor deposition (CVD) processes. Any residual material on the surface of the intrinsic base material 16 can be removed by conventional chemical mechanical polishing (CMP) processes.

Still referring to FIG. 2A, the extrinsic base material 18 and a capping material 25 are formed on the intrinsic base material 16. In embodiments, the extrinsic base material 18 may be a semiconductor material (e.g., Si or SiGe) formed by conventional epitaxial growth process, with an in situ P+ dopant process, e.g., boron. The capping material 25 may be SiN material deposited by a conventional deposition method, e.g., CVD.

Following the deposition process, the extrinsic base material 18 and the capping material 25 may be patterned by conventional lithography and etching processes to form a pedestal 19, e.g., part of the extrinsic base. The etching process can stop on the intrinsic base material 16. A spacer material 20 may be formed over the patterned material, e.g., pedestal 19, in addition to the intrinsic base material 16. In embodiments, the spacer material 20 may be SiN or SiCoN, as examples, deposited by a conventional CVD process.

Figure 2B:
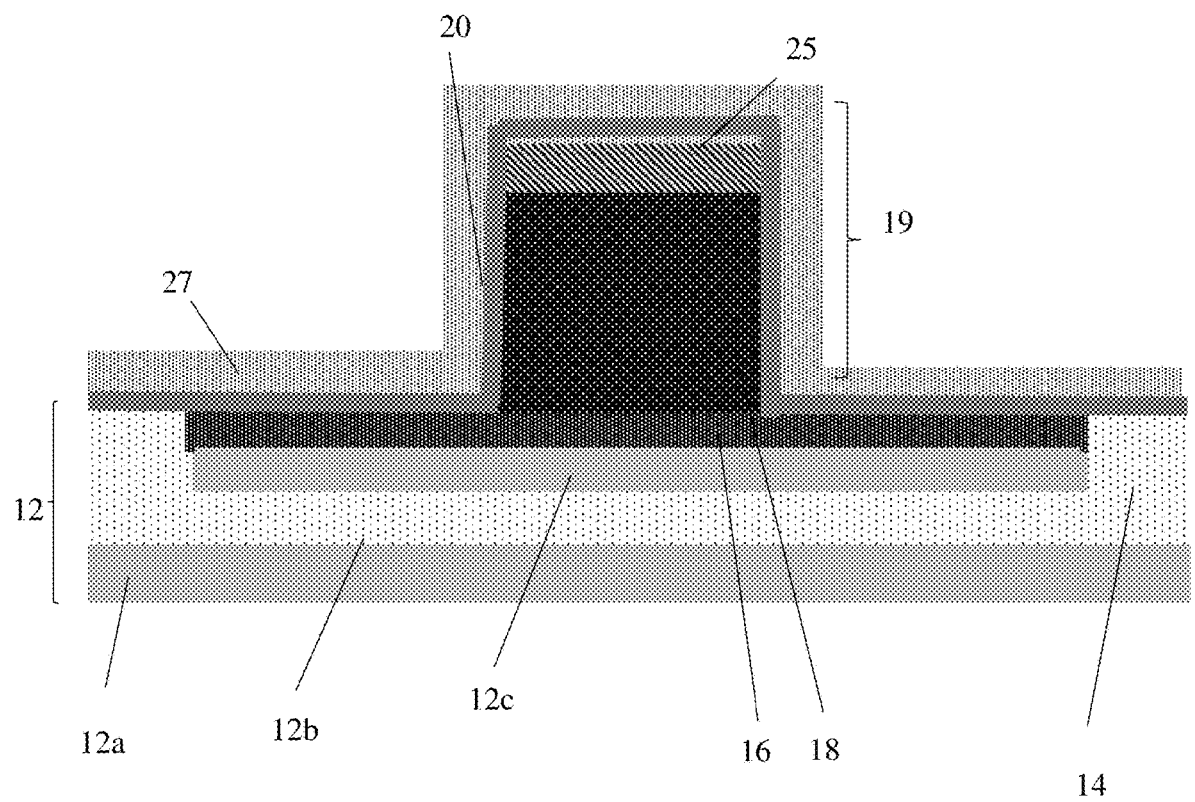

In FIG. 2B, a spacer material 27 may be deposited on the spacer material 20. In embodiments, the spacer material 27 may be an oxide material that has a thickness equivalent to the horizontal extent of the L-shaped spacer 20a shown in FIG. 1. The spacer material 27 can be deposited by a blanket deposition process such as CVD.

Figure 2C:
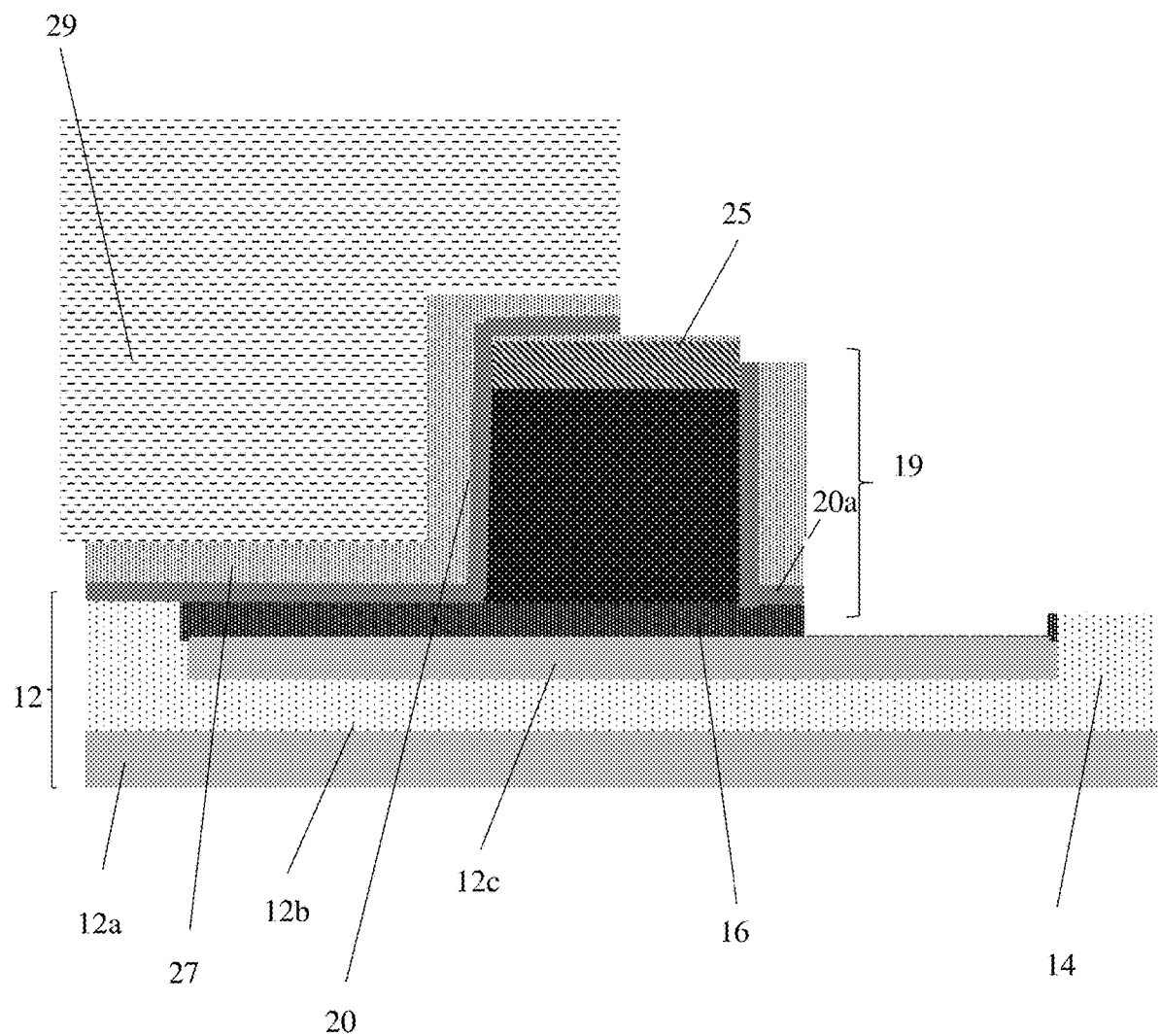

In FIG. 2C, a resist 29 is formed on the emitter side of the structure, extending partially over the patterned pedestal 19. Following the development of the resist, the structure undergoes an anisotropic etching process to remove the horizontally exposed portions of the spacer material 27 and the spacer material 20 over the collector region and the base region. In addition, the anisotropic etching process can be used to pattern e.g., remove, the exposed portions of the intrinsic base material 16. In optional embodiments, the etching process can stop of the marker layer.

In this process, the spacer material 27 and the spacer material 20 may be removed to expose part of the capping material 25, with the spacer material 27 and the spacer material 20 being slightly recessed along the side of the pedestal 19. Also, the removal of the exposed portions of the intrinsic base material 16 will expose the underlying semiconductor layer 12c.

Figure 2D:
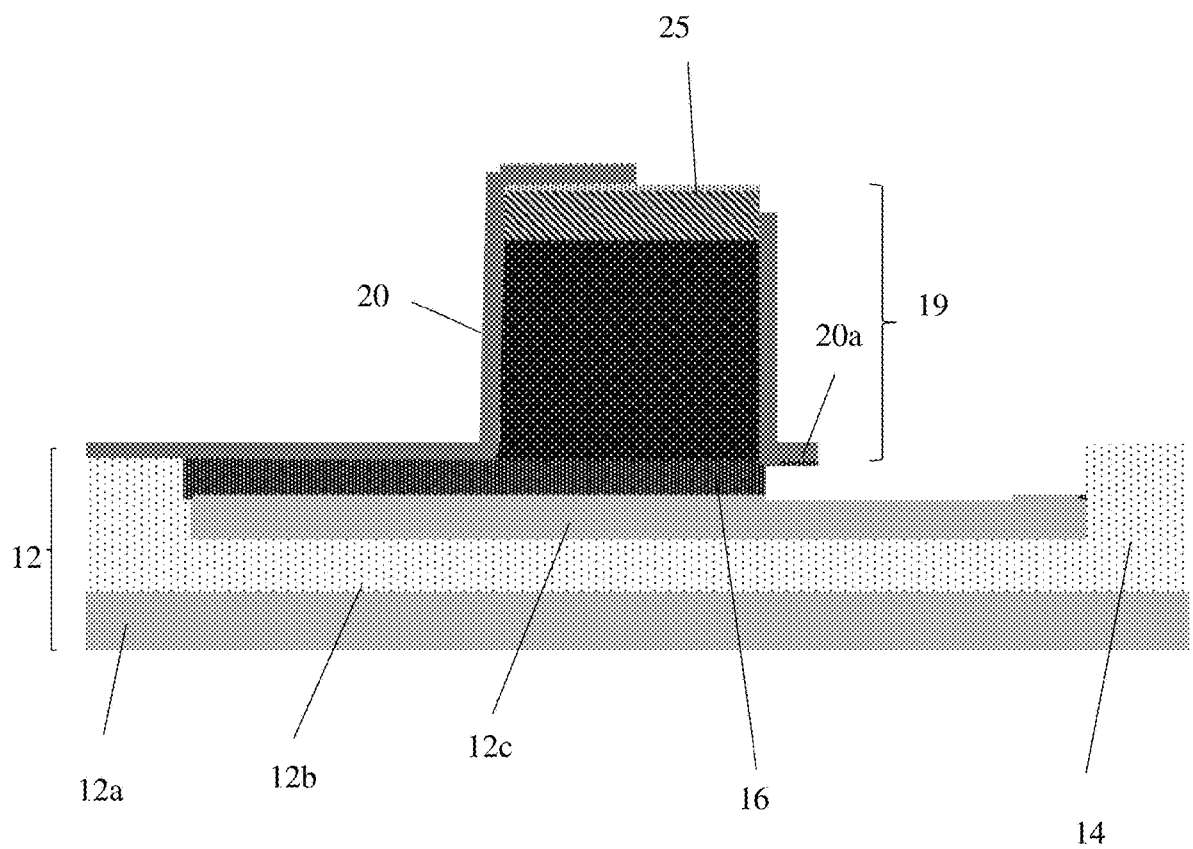

In FIG. 2D, the resist is removed by, for example, an oxygen ashing process or other conventional stripants. The remaining portion of the exposed spacer material 27 may be removed to form the L-shaped spacer 20a. In this process, the spacer material 20 may act as an etch stop material. In addition, during this process, the base material 16 may be recessed under the L-shaped spacer 20a.

Figure 2E:
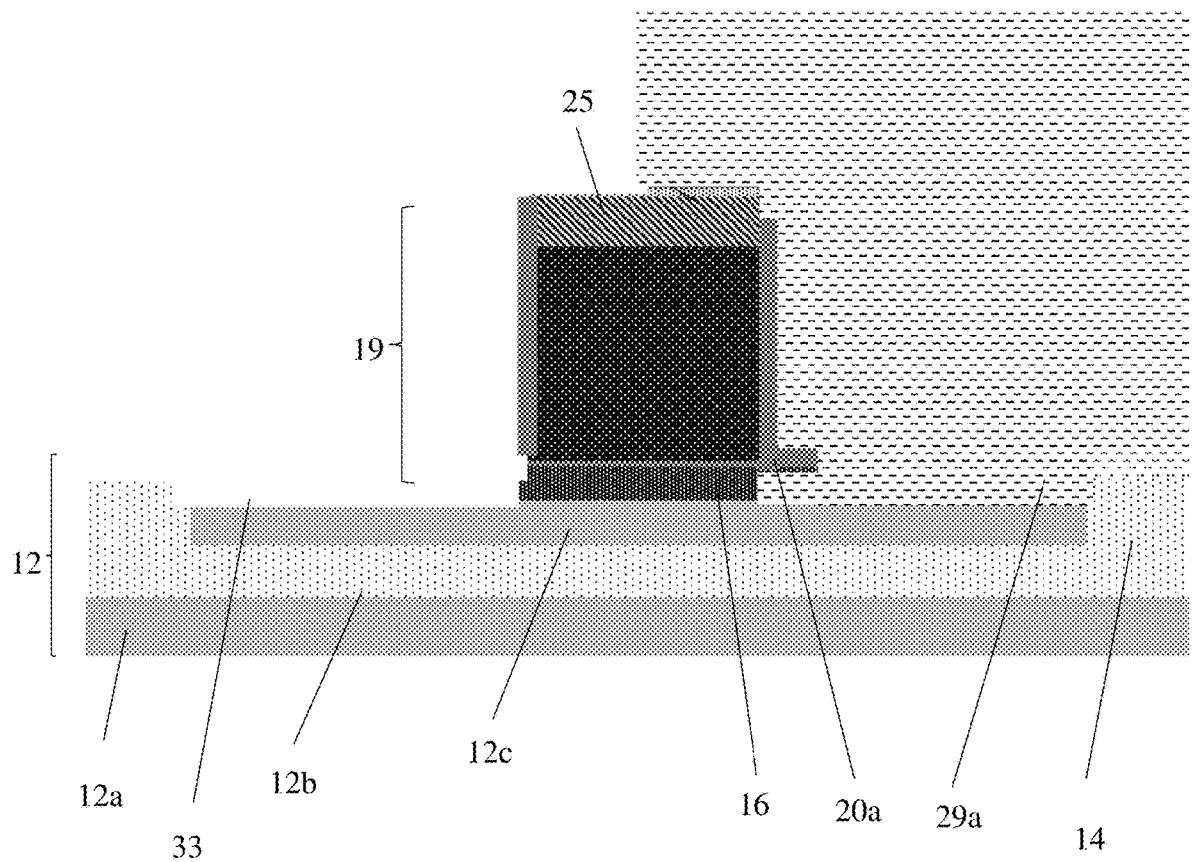

In FIG. 2E, another resist 29a is formed on the collector side of the structure, extending partially over the patterned pedestal 19 and collector side of the structure. The resist can be formed over exposed portions of the L-shaped shaper 20a to protect the L-shaped spacer 20a during a subsequent etching process.

Following the development of the resist, the structure undergoes an anisotropic etching process to remove the horizontally exposed portions of the spacer material 20 over the emitter region and the base region. In addition, the anisotropic etching process can be used to partially pattern e.g., remove, the exposed portions of the intrinsic base material 16 on the emitter side. In this process, the spacer material 20 may be removed to expose part of the capping material 25, with the intrinsic base material 16 being further patterned along the side of the pedestal 19. The optional marker layer may be used as an etch stop during this etching process. This will fully form the intrinsic base 16. Also, the removal of the exposed portions of the intrinsic base material 16 will expose the underlying semiconductor layer 12c. The resist may be removed by an oxygen ashing process.

Figure 2F:
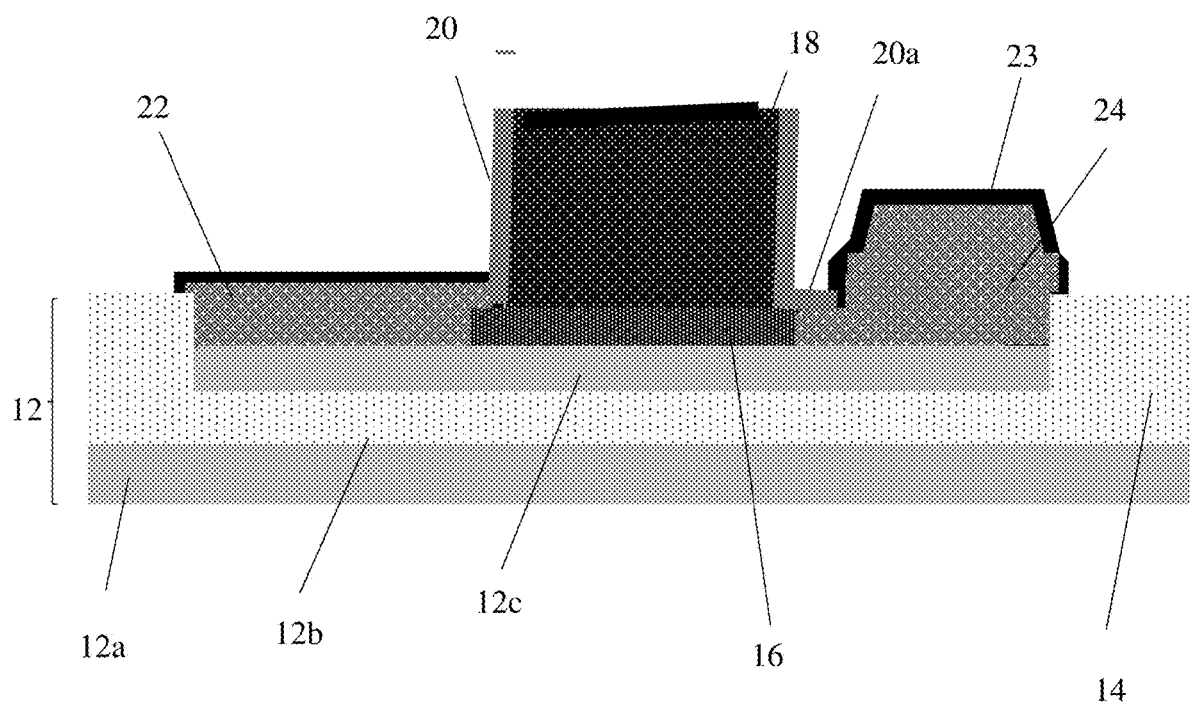

In FIG. 2F, the emitter 22 and collector 24 are formed on the underlying semiconductor layer 12c. In embodiments, the emitter 22 and collector 24 are raised epitaxy regions formed by selectively growing semiconductor material on the semiconductor layer 12c. In accordance with exemplary embodiments, the collector 24 can be faceted. Also, in embodiments, the epitaxy regions may include epitaxially grown Si material, with an in-situ doping process, e.g., N+ dopant such as arsenic or phosphorous. In the epitaxial growth process, the Si material of the collector 24 may be formed partly underneath the L-shaped spacer 20a.

An annealing process may be performed to drive in the dopant into the emitter 22 and collector 24 (in addition to the P+ dopant of the extrinsic base 18). The capping material over the extrinsic base 18 may also be removed by conventional etching processes as is known in the art such that no further explanation is required for a complete understanding of the present disclosure.

A silicide 23 is formed on the emitter 22, collector 24 and the extrinsic base 18. As should be understood by those of skill in the art, the silicide process begins with deposition of a thin transition metal layer, e.g., nickel, cobalt or titanium, over the fully formed and patterned emitter 22, collector 24 and extrinsic base 18. After deposition of the material, the structure is heated allowing the transition metal to react with exposed silicon (or other semiconductor material as described herein) in the active regions of the semiconductor device (e.g., emitter 22, collector 24 and extrinsic base 18) forming a low-resistance transition metal silicide. Following the reaction, any remaining transition metal is removed by chemical etching, leaving silicide contacts 23.

Referring back to FIG. 1, an interlevel dielectric material 26 may be deposited over the emitter 22, collector 24 and extrinsic base 18. The interlevel dielectric material 26 may be a layered structure of oxide and nitride material. The interlevel dielectric material 26 may be deposited by a conventional deposition method, e.g., CVD. The interlevel dielectric material 26 undergoes a patterning process, e.g., lithography and etching, to form vias or trenches to the emitter 22, collector 24 and extrinsic base 18. A conductive material, e.g., tungsten, is deposited within the vias or trenches, making contact to the silicide 23 of the emitter 22, collector 24 and the extrinsic base 18. It should be understood by those of ordinary skill in the art that the vias or trenches can be lined with a barrier metal, e.g., TaN, TiN, etc., prior to the deposition of the tungsten material. Any residual conductive material may be removed from the interlevel dielectric material 26 by a conventional CMP process.

The self-aligned asymmetric spacer can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a base formed on a semiconductor substrate;
    an asymmetrical spacer on the base, the asymmetrical spacer comprising a vertical sidewall directly contacting a first sidewall of the base and an L-shaped sidewall directly contacting another sidewall of the base;
    an emitter on a first side of the base and separated from the base by the vertical sidewall of the asymmetrical spacer; and
    a collector on a second side of the base and separated from the base by the L-shaped sidewall of the asymmetrical spacer,
    wherein the asymmetrical spacer is a single spacer which surrounds the base, wherein the vertical sidewall directly contacts the first sidewall of the base and is adjacent to the emitter and the L-shaped sidewall directly contacts the other sidewall of the base and is adjacent to the collector.

2. The structure of claim 1, wherein collector is farther away from the base than the emitter.

3. The structure of claim 1, wherein a bottom of the L-shaped sidewall on the collector is thicker than the vertical sidewall.

4. The structure of claim 1, wherein the base, the emitter and the collector comprise a lateral heterojunction bipolar transistor.

5. The structure of claim 1, wherein the base comprises an intrinsic base and an extrinsic base vertically above the intrinsic base.

6. The structure of claim 5, wherein the intrinsic base comprises SiGe and the extrinsic base comprises P+ Si material.

7. The structure of claim 5, wherein the emitter and the collector comprise raised N+ Si material of different thicknesses.

8. The structure of claim 7, wherein the collector extends partially underneath the asymmetrical spacer, an entire vertical extent of the vertical sidewall of the asymmetrical spacer and an entire vertical portion of the L-shaped sidewall of the asymmetrical spacer contacts P+ semiconductor material of the extrinsic base.

9. The structure of claim 1, wherein the emitter and the collector are above a marker layer touching a top layer of semiconductor material.

10. A structure comprising:
   an extrinsic base formed over a semiconductor on insulator substrate;
   an asymmetrical spacer comprising a vertical sidewall directly contacting a first sidewall of the extrinsic base and an L-shaped sidewall directly contacting another sidewall of the extrinsic base;
   an emitter separated from the extrinsic base by the vertical sidewall of the asymmetrical spacer; and
   a collector separated from the extrinsic base by the L-shaped sidewall of the asymmetrical spacer,
   wherein the asymmetrical spacer is a single spacer which surrounds the extrinsic base, wherein the vertical sidewall is adjacent to the emitter and the L-shaped sidewall is adjacent to the collector.

11. The structure of claim 10, wherein the collector is farther away from the extrinsic base than the emitter and an entire vertical extent of the vertical sidewall of the asymmetrical spacer and an entire vertical portion of the L-shaped sidewall of the asymmetrical spacer contacts P+ semiconductor material of the extrinsic base.

12. The structure of claim 11, wherein a bottom surface of the L-shaped sidewall is thicker than the vertical sidewall.

13. The structure of claim 10, wherein the extrinsic base is vertically above an intrinsic base, which is on the semiconductor on insulator substrate.

14. The structure of claim 13, wherein the intrinsic base comprises SiGe and the extrinsic base comprises P+ Si material.

15. The structure of claim 14, wherein the emitter and the collector comprise raised N+ Si material.

16. The structure of claim 10, wherein the collector extends partially underneath the asymmetrical spacer.

17. The structure of claim 10, wherein the emitter and the collector are above marker layer touching a top layer of semiconductor material.

18. The structure of claim 10, wherein the asymmetrical spacer comprises SiN.

19. A method comprising:
   forming a base on a semiconductor substrate;
   forming an asymmetrical spacer surrounding the base by depositing dielectric material in a single deposition step prior to formation of a collector;
   forming an emitter on a first side of the base and separated from the base by the asymmetrical spacer; and
   forming the collector on a second side of the base and separated from the base by the asymmetrical spacer.

* * * * *